United States Patent
Aramaki et al.

(10) Patent No.: US 9,966,324 B2
(45) Date of Patent: May 8, 2018

(54) THERMALLY CONDUCTIVE SHEET, METHOD FOR PRODUCING SAME, AND SEMICONDUCTOR DEVICE

(71) Applicant: Dexerials Corporation, Tokyo (JP)

(72) Inventors: Keisuke Aramaki, Tochigi (JP); Atsuya Yoshinari, Tochigi (JP); Takuhiro Ishii, Tochigi (JP); Shin-ichi Uchida, Tochigi (JP); Masahiko Ito, Tochigi (JP); Syunsuke Uchida, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days. days.

(21) Appl. No.: 14/892,724

(22) PCT Filed: Jun. 18, 2014

(86) PCT No.: PCT/JP2014/066095
§ 371 (c)(1),
(2) Date: Nov. 20, 2015

(87) PCT Pub. No.: WO2014/208408
PCT Pub. Date: Dec. 31, 2014

(65) Prior Publication Data
US 2016/0104657 A1  Apr. 14, 2016

(30) Foreign Application Priority Data

Jun. 27, 2013 (JP) .................. 2013-135221
Jun. 5, 2014 (JP) .................. 2014-116981

(51) Int. Cl.
*H01L 23/373* (2006.01)
*H01L 21/48* (2006.01)
(Continued)

(52) U.S. Cl.
CPC ...... *H01L 23/3737* (2013.01); *B29C 47/0004* (2013.01); *B29C 47/0019* (2013.01);
(Continued)

(58) Field of Classification Search
CPC ............. H01L 23/3733; H01L 23/3737; H01L 23/373
See application file for complete search history.

(56) References Cited

U.S. PATENT DOCUMENTS

2013/0136895 A1  5/2013  Usui et al.
2014/0349067 A1  11/2014  Usui et al.

FOREIGN PATENT DOCUMENTS

CN   102971365   3/2013
EP   0 937 744   8/1999
(Continued)

OTHER PUBLICATIONS

Chinese office action issued or corresponding Chinese application with English translation.

*Primary Examiner* — Ermias Woldegeorgis
(74) *Attorney, Agent, or Firm* — Carmody Torrance Sandak & Hennessey LLP

(57) ABSTRACT

A thermally conductive sheet, which contains: a binder; carbon fibers; and an inorganic filler, wherein the thermally conductive sheet is to be sandwiched between a heat source and a heat dissipation member of a semiconductor device, wherein the carbon fibers have an average fiber length of 50 μm to 250 μm, wherein thermal resistance of the thermally conductive sheet is less than 0.17 K·cm$^2$/W, as measured in accordance with ASTM-D5470 with a load of 7.5 kgf/cm$^2$, and wherein the thermally conductive sheet has an average thickness of 500 μm or less.

6 Claims, 3 Drawing Sheets

(51) Int. Cl.
*C09K 5/14* (2006.01)
*B29C 47/00* (2006.01)
*B29C 47/88* (2006.01)
*B29C 35/08* (2006.01)

(52) U.S. Cl.
CPC ...... *B29C 47/0021* (2013.01); *B29C 47/0066* (2013.01); *B29C 47/8805* (2013.01); *C09K 5/14* (2013.01); *H01L 21/4871* (2013.01); *H01L 23/373* (2013.01); *H01L 23/3733* (2013.01); *B29C 2035/0822* (2013.01); *B29K 2995/0013* (2013.01); *H01L 2924/0002* (2013.01)

(56) References Cited

FOREIGN PATENT DOCUMENTS

| | | |
|---|---|---|
| JP | 2006-335957 | 12/2006 |
| JP | 2006335958 A * | 12/2006 |
| JP | 2011-241403 | 12/2011 |
| JP | 2012-015273 | 1/2012 |
| JP | 2012001638 A * | 1/2012 |
| JP | 2012-023335 | 2/2012 |

* cited by examiner

THERMALLY CONDUCTIVE SHEET, METHOD FOR PRODUCING SAME, AND SEMICONDUCTOR DEVICE

TECHNICAL FIELD

The present invention relates to a thermally conductive sheet, a production method thereof, and a semiconductor device.

BACKGROUND ART

Semiconductor elements have been improved to have high density and to be highly mounted, along further improvement in quality of electronic devices. It is important to more efficiently radiate heat generated from an electronic part constituting an electronic device because of the aforementioned trends. In order to efficiently radiate heat, a semiconductor element is mounted to a heat sink, such as a radiating fin, and a heat sink plate. As for a thermally conductive sheet, a thermally conductive sheet, in which filler (thermally conductive filler), such as inorganic filler, is dispersed in silicone, has been widely used. Examples of the inorganic filler include alumina, aluminum nitride, and aluminum hydroxide.

Various researches have been conducted on the thermally conductive sheet for the purpose of achieving high thermal conductivity.

For example, it has been attempted to increase a filling rate of the inorganic filler blended in a matrix. If the filling rate of the inorganic filler is increased, however, a flexibility of a resulting thermally conductive sheet may be impaired, or powdering may occur due to the high filling rate of the inorganic filler. Therefore, there is a limitation in a method for increasing the filling rate of the inorganic filler.

Moreover, proposed are techniques for adding boron nitride (BN), flaky particles, such as graphite, or carbon fiber in a matrix (for example, see PTL 1 and PTL 2). These proposed techniques are those utilizing anisotropy of thermal conductivity, which the flaky particles or the like have. In case of carbon fiber, for example, there is thermal conductivity of about 600 W/m·K to about 1,200 W/m·K in a direction of alignment of the fiber. In case of boron nitride, there is thermal conductivity of about 110 W/m·K in the in-plane direction, and about 2 W/m·K in a direction vertical to the in-plane direction. These materials have been known to have anisotropy.

In recent years, high density and highly dense mounting of a semiconductor element are significantly advanced. Therefore, even higher thermal conductivity of a thermally conductive sheet has been required. Moreover, it is desired to achieve high thermal conductivity with a thin sheet.

Use of the carbon fiber can provide a thermally conductive sheet, which realizes both excellent high thermal conductivity and flexibility (for example, see PTL 3). However, use of a thin sheet (for example, the average thickness being 500 μm or less) increases thermal resistance at an interface. Therefore, it has not yet provided a thermally conductive sheet, which realizes both excellent high thermal conductivity that is required recently, and excellent flexibility.

Accordingly, there are currently needs for a thermally conductive sheet, which can achieve both excellent high thermal conductivity, and excellent flexibility with a small thickness, a production method thereof, and a semiconductor device using the thermally conductive sheet.

CITATION LIST

Patent Literature

PTL 1: Japanese Patent Application Laid-Open (JP-A) No. 2006-335957
PTL 2: JP-A No. 2012-15273
PTL 3: JP-A No. 2011-241403

SUMMARY OF INVENTION

Technical Problem

The present invention aims to solve the aforementioned various problems in the art, and to achieve the following object. Specifically, an object of the present invention is to provide a thermally conductive sheet, which can achieve both excellent high thermal conductivity, and excellent flexibility with a small thickness, a production method thereof, and a semiconductor device using the thermally conductive sheet.

Solution to Problem

The means for solving the aforementioned problems are as follows:
<1> A thermally conductive sheet, containing:
  a binder;
  carbon fibers; and
  an inorganic filler,
  wherein the thermally conductive sheet is to be sandwiched between a heat source and a heat dissipation member of a semiconductor device,
  wherein the carbon fibers have an average fiber length of 50 μm to 250 μm,
  wherein thermal resistance of the thermally conductive sheet is less than 0.17 K·cm$^2$/W, as measured in accordance with ASTM-D5470 with a load of 7.5 kgf/cm$^2$, and
  wherein the thermally conductive sheet has an average thickness of 500 μm or less.
<2> The thermally conductive sheet according to <1>, wherein the thermal resistance of the thermally conductive sheet is 0.20 K·cm$^2$/W or less, as measured in accordance with ASTM-D5470 with a load in the range of 2.0 kgf/cm$^2$ to 7.5 kgf/cm$^2$.
<3> The thermally conductive sheet according to <1> or <2>, wherein part of the carbon fibers is aligned at a surface of the thermally conductive sheet in a manner that major axes of the carbon fibers are aligned along an in-plane direction of the thermally conductive sheet.
<4> The thermally conductive sheet according to any one of <1> to <3>, wherein the inorganic filler contains alumina.
<5> The thermally conductive sheet according to <4>, wherein the alumina has an average particle diameter of 1 μm to 5 μm.
<6> The thermally conductive sheet according to any one of <1> to <5>, wherein the inorganic filler contains aluminum nitride.
<7> The thermally conductive sheet according to any one of <1> to <6>, wherein an amount of the carbon fibers is 20% by volume to 40% by volume.
<8> The thermally conductive sheet according to any one of <1> to <7>, wherein an amount of the inorganic filler is 30% by volume to 55% by volume.
<9> The thermally conductive sheet according to any one of <1> to <8>, wherein the average thickness (μm) of the thermally conductive sheet is greater than the average fiber length (μm) of the carbon fiber.

<10> A method for producing the thermally conductive sheet according to any one of <1> to <9>, the method containing:

extruding a thermally conductive composition containing a binder precursor, carbon fibers, and an inorganic filler using an extruder, to obtain an extrusion-molded product;

curing the extrusion-molded product, to obtain a cured product; and cutting the cured product in a vertical direction relative to a direction of the extruding, to give an average thickness of 500 μm or less.

<11> A semiconductor device, containing:

a heat source;

a heat dissipation member; and a thermally conductive sheet, which is sandwiched between the heat source and the heat dissipation member, wherein the thermally conductive sheet is the thermally conductive sheet according to any one of claims 1 to 9.

Advantageous Effects of the Invention

The present invention can solve the aforementioned various problems in the art, achieve the aforementioned object, and provide a thermally conductive sheet, which can achieve both excellent high thermal conductivity, and excellent flexibility with a small thickness, a production method thereof, and a semiconductor device using the thermally conductive sheet.

DESCRIPTION OF EMBODIMENTS (Thermally Conductive Sheet)

Figure 1A:
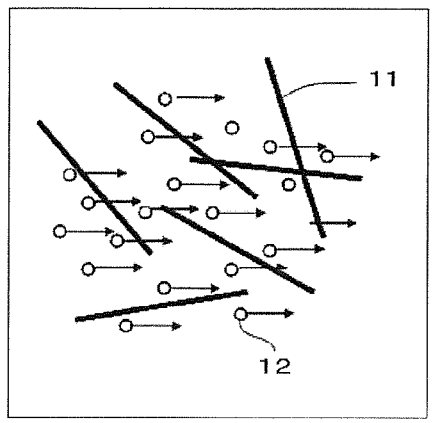
FIG. 1A is a schematic diagram illustrating a state of orientations of carbon fibers at the time of extrusion molding.

The thermally conductive sheet of the present invention contains at least a binder, carbon fibers, and an inorganic filler, and may further contain other components, if necessary.

The thermally conductive sheet is a sandwiched between a heat source and heat dissipation member of a semiconductor device.

<Binder>

The binder is appropriately selected depending on the intended purpose without any limitation, and examples thereof include a binder resin. Examples of the binder resin include a thermoplastic polymer, and a cured product of a thermoset polymer.

Examples of the thermoplastic polymer include a thermoplastic resin, a thermoplastic elastomer, and a polymer alloy thereof.

The thermoplastic resin is appropriately selected depending on the intended purpose without any limitation, and examples thereof include polyethylene, polypropylene, an ethylene-α-olefin copolymer, polymethyl pentene, polyvinyl chloride, polyvinylidene chloride, polyvinyl acetate, an ethylene-vinyl acetate copolymer, polyvinyl alcohol, polyacetal, polyvinylidene fluoride, polytetrafluoroethylene, polyethylene terephthalate, polybutylene terephthalate, polyethylene naphthalate, polystyrene, polyacrylonitrile, a styrene-acrylonitrile copolymer, an acrylonitrile-butadiene-styrene copolymer (ABS) resin, polyphenylene ether, modified polyphenylene ether, aliphatic polyamides, aromatic polyamides, polyamide imide, polymethacrylic acid or an ester thereof, polyacrylic acid or an ester thereof, polycarbonate, polyphenylene sulfide, polysulfone, pol ether sulfone, polyether nitrile, polyether ketone, polyketone, a liquid crystal polymer, a silicone resin, and ionomer. These may be used alone, or in combination.

Examples of the thermoplastic elastomer include a styrene-based thermoplastic elastomer, an olefin-based thermoplastic elastomer, a vinyl chloride-based thermoplastic elastomer, a polyester-based thermoplastic elastomer, a polyurethane-based thermoplastic elastomer, and a polyamide-based thermoplastic elastomer. These may be used alone, or in combination.

Examples of the thermoset polymer include a cross-linked rubber, an epoxy resin, a polyimide resin, a bismaleimide resin, a benzocyclobutene resin, a phenol resin, an unsaturated polyester, a diallyl phthalate resin, a silicone resin, polyurethane, polyimide silicone, thermoset polyphenylene ether, and thermoset polyphenylene ether. These may be used alone, or in combination.

Examples of the cross-linked rubber include natural rubber, butadiene rubber, isoprene rubber, nitrile rubber, hydrogenated nitrile rubber, chloroprene rubber, ethylenepropylene rubber, chlorinated polyethylene, chlorosulfonated polyethylene, butyl rubber, halogenated butyl rubber, fluororubber, urethane rubber, acryl rubber, polyisobutylene rubber, and silicone rubber. These may be used alone, or in combination.

Among them, the thermoset polymer is particularly preferably a silicone resin, in view of adhesion and followability to electronic parts, as well as excellent moldability, and weather resistance thereof.

The silicone resin is appropriately selected depending on the intended purpose without any limitation, and examples thereof include an addition-curable liquid silicone resin, and a heat-vulcanizing millable silicone resin, in which peroxide is used for vulcanization. Among them, an addition-curable liquid silicone resin is particularly preferable, because adhesion between a heat-generating surface of an electronic part and a heat sink surface is required for a heat dissipation member used for an electronic device.

The addition-curable liquid silicone resin is preferably a two-part addition reaction-curable silicone resin, in which polyorganosiloxane having a vinyl group is used as an A liquid, and polyorganosiloxane having a Si—H group is used as a B liquid. A blending ratio of the A liquid and the B liquid is appropriately selected depending on a desired flexibility of a resulting thermally conductive sheet.

An amount of the binder in the thermally conductive sheet is appropriately selected depending on the intended purpose without any limitation, but the amount thereof is preferably 25% by volume to 50% by volume.

<Carbon Fibers>

The carbon fibers are appropriately selected depending on the intended purpose without any limitation, provided that the average fiber length (average major axis length) thereof is 50 μm to 250 μm. Examples thereof include pitch-based carbon fibers, PAN-based carbon fibers, and carbon fibers synthesized by arc discharge, laser vaporization, chemical vapor deposition (CVD), and catalytic chemical vapor deposition (CCVD). Among them, pitch-based carbon fibers are particularly preferable in view of thermal conductivity.

As for the carbon fibers, carbon fibers, part or whole of which is surface treated may be optionally used. Examples of the surface treatment include oxidation, nitriding, nitration, sulfonation, and a treatment where metal, a metal compound, or an organic compound is deposited or bonded to a functional group introduced by any of the aforementioned treatments, or a surface of the carbon fiber. Examples of the functional group include a hydroxyl group, a carboxyl group, a carbonyl group, a nitro group, and an amino group.

It is preferred in view of reduction of thermal resistance that part of the carbon fibers be provided at a surface of the thermally conductive sheet in a manner that a major axes of the carbon fibers be aligned along the in-plane direction of the thermally conductive sheet.

The average fiber length (average major axis length) of the carbon fibers is 50 μm to 250 μm, preferably 75 μm to 200 μm, more preferably 100 μm to 150 μm. When the average fiber length is less than 50 μm, sufficient anisotropic thermal conductivity may not be attained, and hence thermal resistance thereof may become high. When the average fiber length is greater than 250 μm, compressibility of the thermally conductive sheet reduces, and thus sufficiently low thermal resistance may not be attained at the time of use.

The average minor axis length of the carbon fibers is appropriately selected depending on the intended purpose without any limitation, but the average minor axis length thereof is preferably 6 μm to 15 μm, and more preferably 8 μm to 13 μm.

An aspect ratio (average major axis length/average minor axis length) of the carbon fiber is appropriately selected depending on the intended purpose without any limitation, but the aspect ratio thereof is preferably 8 or greater, more preferably 12 to 30. When the aspect ratio is less than 8, the thermal conductivity may be low, as the fiber length (the major axis length) of the carbon fiber is short.

For example, the average major axis length, and average minor axis length of the carbon fibers can be measured by means of a microscope, or a scanning electron microscope (SEM).

An amount of the carbon fibers in the thermally conductive sheet is appropriately selected depending on the intended purpose without any limitation, but the amount thereof is preferably 20% by volume to 40% by volume, more preferably 22% by volume to 36% by volume, and particularly preferably 28% by volume to 36% by volume. When the amount thereof is less than 20% by volume, it may be difficult to attain sufficiently low thermal resistance. When the amount thereof is greater than 40% by volume, formability of the thermally conductive sheet and the orientation of the carbon fiber may be affected.

<Inorganic Filler>

A shape, material, and average particle diameter of the inorganic filler are appropriately selected depending on the intended purpose without any limitation. The shape thereof is appropriately selected depending on the intended purpose without any limitation, and examples thereof include spherical shapes, spheroidal shapes, bulk shapes, particle shapes, flat shapes, and needle shapes. Among them, the spherical shapes and spheroidal shapes are preferable in view of filling, and the spherical shapes are particularly preferable.

Note that, in the present specification, the inorganic filler is different from the carbon fiber.

Examples of the inorganic filler include aluminum nitride (AlN), silica, alumina (aluminum oxide), boron nitride, titania, glass, zinc oxide, silicon carbide, silicon, silicon oxide, aluminum oxide, and metal particles. These may be used alone, or in combination. Among them, alumina, boron nitride, aluminum nitride, zinc oxide, and silica are preferable. In view of the thermal conductivity thereof, alumina, and aluminum nitride are particularly preferable.

Note that, the inorganic filler may be subjected to a surface treatment. When the inorganic filler is treated with a coupling agent, as the surface treatment, dispersibility of the inorganic filler is improved, to thereby improve flexibility of a resulting thermally conductive sheet.

The average particle diameter of the inorganic filler is appropriately selected depending on the intended purpose without any limitation.

In the case where the inorganic filler is alumina, the average particle diameter thereof is preferably 1 μm to 10 μm, more preferably 1 μm to 5 μm, and particularly preferably 4 μm to 5 μm. When the average particle diameter thereof is smaller than 1 μm, a viscosity of a composition is high, and it may be difficult to mix. When the average particle diameter thereof is greater than 10 μm, thermal resistance of the thermally conductive sheet may become large.

In the case where the inorganic filler is aluminum nitride, the average particle diameter thereof is preferably 0.3 μm to 6.0 μm, more preferably 0.3 μm to 2.0 μm, and particularly preferably 0.5 μm to 1.5 μm. When the average particle diameter thereof is smaller than 0.3 μm, a viscosity of a composition is high, and it may be difficult to mix. When the average particle diameter thereof is greater than 6.0 μm, thermal resistance of the thermally conductive sheet may become large.

For example, the average particle diameter of the inorganic filler can be measured by a particle size analyzer, or a scanning electron microscope (SEM).

The specific surface area of the inorganic filler is appropriately selected depending on the intended purpose without any limitation.

In the case where the inorganic filler is alumina, the specific surface area thereof is preferably 0.3 $m^2/g$ to 0.9 $m^2/g$.

In the case where the inorganic filler is aluminum nitride, the specific surface area thereof is preferably 1 $m^2/g$ to 3 $m^2/g$.

For example, the specific surface area of the inorganic filler can be measured by the BET method.

An amount of the inorganic filler in the thermally conductive sheet is appropriately selected depending on the intended purpose without any limitation, but the amount thereof is preferably 30% by volume to 55% by volume, more preferably 35% by volume to 50% by volume. When the amount thereof is less than 30% by volume, thermal resistance of the thermally conductive sheet may become large. When the amount thereof is greater than 55% by volume, flexibility of the thermally conductive sheet may be low.

<Other Components>

The aforementioned other components are appropriately selected depending on the intended purpose without any limitation, and examples thereof include a thixotropic agent, a dispersing agent, a curing accelerator, a retarder, a slight-tackiness imparting agent, a plasticizer, a flame retardant, an antioxidant, a stabilizer, and a colorant.

The average thickness of the thermally conductive sheet is 500 μm or less, preferably 100 μm to 400 μm, and more preferably 200 μm to 350 μm. The average thickness is an average thickness of the thermally conductive sheet, to which a load is not applied.

The average thickness (μm) of the thermally conductive sheet is preferably greater than the average fiber length (μm) of the carbon fiber. By adjusting the average thickness of the thermally conductive sheet in the aforementioned manner, the resulting thermally conductive sheet is easily compressed at the time of use, and sufficiently low thermal resistance can be attained.

The compression ratio of the thermally conductive sheet is preferably 5% or greater, more preferably 10% to 70%, when a load of 7.5 kgf/cm² is applied. When the compression ratio is less than 5%, the thermal resistance may not be small when compressed.

The compression ratio can be determined by the following formula.

Compression ratio (%)=100×(X−Y)/X

X: The average thickness (μm) of the thermally conductive sheet before applying a load.

Y: The average thickness (μm) of the thermally conductive sheet after applying a load of 7.5 kgf/cm².

The thermal resistance of the thermally conductive sheet as measured in accordance with ASTM-D5470 with a load of 7.5 kgf/cm² is less than 0.17 K·cm²/W. The lower limit of the thermal resistance is appropriately selected depending on the intended purpose without any limitation, but the lower limit thereof is preferably 0.04 K·cm²/W.

A reason why the thermal resistance is measured upon application of a load is because a load is typically applied on the thermally conductive sheet at the time of use, as the thermally conductive sheet is sandwiched between a heat source and a heat dissipation member of a semiconductor device. A thickness of the thermally conductive sheet, a density and orientation of the carbon fiber in the thermally conductive sheet, and a density of the inorganic filler in the thermally conductive sheet are changed between the case where a load is applied to the thermally conductive sheet and the case where no load is applied to the thermally conductive sheet. Therefore, the thermal resistance varies.

The thermal resistance of the thermally conductive sheet is preferably 0.20 K·cm²/W or less, when the thermal resistance thereof is measured in accordance with ASTM-D5470 with a load in the range of 2.0 kgf/cm² to 7.5 kgf/cm². It is advantageous to adjust the thermal resistance of the thermally conductive sheet to the aforementioned range, as the thermally conductive sheet having an extremely excellent thermal resistance without being affected by an environment for use can be attained. The lower limit of the thermal resistance is appropriately selected depending on the intended purpose without any limitation, but the lower limit thereof is preferably 0.04 K·cm²/W.

A production method of the thermally conductive sheet is appropriately selected depending on the intended purpose without any limitation, but the production method thereof is preferably the production method of a thermally conductive sheet of the present invention, which is explained below.

(Production Method of Thermally Conductive Sheet)

The production method of a thermally conductive sheet of the present invention contains at least an extrusion-molding step, a curing step, and a cutting step, and may further contain other steps, if necessary.

<Extrusion-Molding Step>

The extrusion-molding step is appropriately selected depending on the intended purpose without any limitation, provided that it contains extruding a thermally conductive composition using an extruder to obtain an extrusion-molded product.

—Thermally Conductive Composition—

The thermally conductive composition contains a binder precursor, carbon fibers, and an inorganic filler, and may further contain other components, if necessary.

The binder precursor is the binder precursor, which is to be a binder of the thermally conductive sheet after being cured in the below-mentioned curing step, and examples thereof include those listed as the thermoset polymer in the descriptions of the thermally conductive sheet of the present invention.

The carbon fiber is the carbon fiber listed in the descriptions of the thermally conductive sheet of the present invention.

The inorganic filler is the inorganic filler listed in the descriptions of the thermally conductive sheet of the present invention.

The thermally conductive composition can be prepared by mixing the binder precursor, the carbon fiber, the inorganic filler, and optionally other components by means of a mixer.

An extrusion-molded product can be obtained by extrusion molding the thermally conductive composition into a mold by means of an extruder.

The extruder is appropriately selected depending on the intended purpose without any limitation.

Typically, a plurality of slits are provided to an extrusion outlet of the extruder, and the slits align the carbon fiber along the extruding direction.

A shape and size of the slit are appropriately selected depending on the intended purpose without any limitation. Examples of the shape of the slit include a plate shape, a lattice shape, and a honey-comb shape. A size (width) of the slit is appropriately selected depending on the intended purpose without any limitation, but the size thereof is preferably 0.5 mm to 10 mm.

An extrusion speed of the thermally conductive composition is appropriately selected depending on the intended purpose without any limitation, but the extrusion speed thereof is preferably 0.001 L/min or faster.

A shape, size, and material of the mold are appropriately selected depending on the intended purpose without any limitation. Examples of the shape thereof include a hollow cylindrical shape, and a hollow prismatic shape. The size thereof can be appropriately selected depending on a size of the thermally conductive sheet to be produced. Examples of the material thereof include stainless steel.

In the process that the thermally conductive composition passes through the extruder, the carbon fiber, and the inorganic filler are moved towards a centric direction of the thermally conductive composition, and thus the densities of the carbon fiber and the inorganic filler are different between a surface of the extrusion-molded product and the centric part thereof. Specifically, the carbon fiber and the inorganic filler are not projected from a surface of the thermally conductive composition (shaped product) passed through the extruder. Therefore, a surface portion (a peripheral part of the thermally conductive sheet) of a cured product obtained by curing the thermally conductive composition (shaped product) has excellent slight tackiness, and thus the adhesion to an adherend (a semiconductor device) is excellent.

Figure 1B:
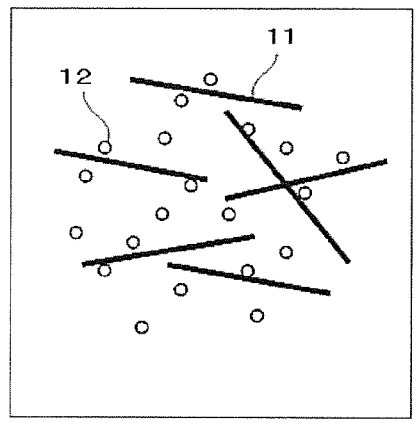
FIG. 1B is a schematic diagram illustrating a state of orientations of carbon fibers at the time of extrusion molding.

As illustrated in FIGS. 1A and 1B, moreover, the carbon fiber can be aligned along the extruding direction by extrusion-molding the thermally conductive composition containing the carbon fiber 11, and the inorganic filler 12.

In the present specification, the term "slight tackiness" means a degree of tackiness where there is re-releasability without a significant increase in the adhesion due to the lapsed time, and moisture and heat, and it is not easily dispositioned when it is attached to an adherend.

<Curing Step>

The curing step is a step containing curing the extrusion-molded product to obtain a cured product.

The extrusion-molded product, which is shaped in the extrusion-molding step, is turned into a cured product through an appropriate curing reaction depending on the binder precursor for use.

A curing method of the extrusion-molded product is appropriately selected depending on the intended purpose without any limitation. In the case where a thermoset polymer, such as a silicone resin, is used as the binder precursor, it is preferred that curing be performed by heating.

Examples of a device used for the heating include a far infrared furnace, and a hot-air oven.

The heating temperature is appropriately selected depending on the intended purpose without any limitation, but the heating is preferably performed at 40° C. to 150° C.

A flexibility of the silicone cured product, which is formed by curing the silicone resin, is appropriately selected depending on the intended purpose without any limitation. For example, the flexibility thereof can be adjusted with a crosslinking density of a silicone cured product, a filling amount of the carbon fiber, and a filling amount of the inorganic filler.

<Cutting Step>

The cutting step is appropriately selected depending on the intended purpose without any limitation, provided that the cutting step is a step containing cutting the cured product in a vertical direction relative to a direction of the extrusion, to give an average thickness of 500 μm or less.

For example, the cutting is performed by means of a ultrasonic wave cutter, and a plane. As with the ultrasonic wave cutter, an oscillating frequency and amplitude can be adjusted. The oscillating frequency is preferably adjusted in the range of 10 kHz to 100 kHz, and the amplitude is preferably adjusted in the range of 10 μm to 100 μm. If the cutting is performed by means of a cutter knife, or a meat slicer (rotary blade), not the ultrasonic wave cutter, a surface roughness Ra of the cut surface is large, and thus thermal resistance becomes large.

In the cutting step, a thermally conductive sheet, in which the carbon fiber is aligned in the thickness direction of the thermally conductive sheet (vertically aligned) by cutting the cured product, which completed a curing reaction, in the vertical direction relative to the extruding direction to give a predetermined thickness.

In the case where the blending ratio (mass ratio) of the A liquid and the B liquid in the addition-curable liquid silicone resin is in the range of A liquid:B liquid=5:5 to 6:4, moreover, a thermally conductive sheet containing, at a surface thereof, carbon fiber, which is aligned along an in-plane direction of the thermally conductive sheet is attained by depositing part of the carbon fiber at the surface of the thermally conductive sheet in the manner that the major axes of the carbon fibers are aligned along the in-plane direction of the thermally conductive sheet, at the time of cutting.

In order to obtain a thermally conductive sheet containing, at a surface thereof, carbon fibers are aligned along the in-plane direction of the thermally conductive sheet, moreover, the blending ratio (mass ratio) of the A liquid to the B liquid in the addition-curable liquid silicone resin is particularly preferably in the range of A liquid:B liquid=5:5 to 6:4. When the A liquid is small in the blending ratio, the carbon fiber is not deposited at the surface of the thermally conductive sheet. When the A liquid is large in the blending ratio, the flexibility of the thermally conductive sheet is too high, and thus the production of the thermally conductive sheet becomes difficult.

One example of the production method of a thermally conductive sheet of the present invention is explained with reference to a drawing.

Figure 2:
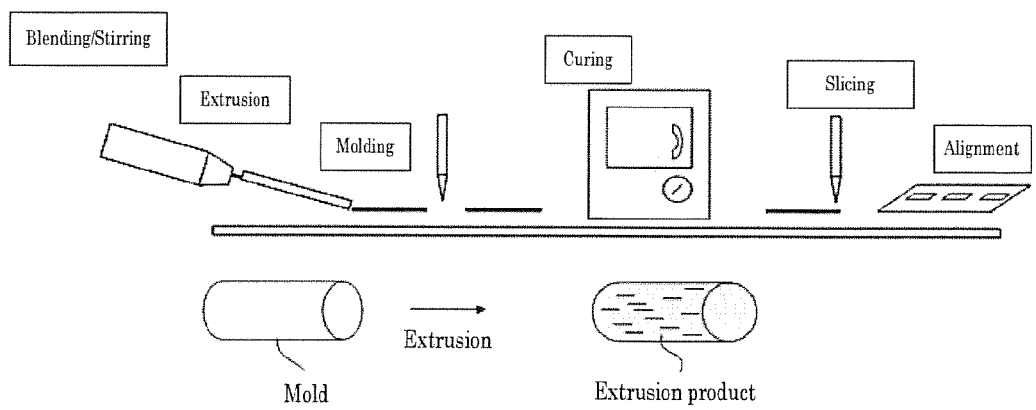
FIG. 2 is a schematic diagram for explaining one example of a production method of a thermally conductive sheet of the present invention.

As illustrated in FIG. 2, a thermally conductive sheet is produced through a series of steps, such as extrusion, molding, curing, and cutting (slicing).

First, as illustrated in FIG. 2, a thermally conductive composition is prepared by blending and stirring a binder precursor, carbon fibers, and an inorganic filler. Subsequently, making the prepared thermally conductive composition pass through a plurality of slits at the time of extrusion molding, to thereby align the carbon fibers blended in the thermally conductive composition in a thickness direction of the thermally conductive sheet. After curing the obtained shaped product, the resulting cured product is cut (sliced) by an ultrasonic wave cutter in a vertical direction relative to the extrusion direction to give the predetermined thickness, to thereby produce a thermally conductive sheet.

(Semiconductor Device)

The semiconductor device of the present invention contains a heat dissipation member, a heat source, and a thermally conductive sheet, and may further contain other members, if necessary.

The thermally conductive sheet is sandwiched between the heat source and the heat dissipation member.

<Heat Source>

A semiconductor element serving as the heat source is appropriately selected depending on the intended purpose without any limitation, and examples thereof include CPU, MPU, and a graphic arithmetic element.

<Heat Dissipation Member>

The heat dissipation member is appropriately selected depending on the intended purpose without any limitation, provided that the heat dissipation member transfer the heat generated from the semiconductor element and radiates to the outside. Examples thereof include a radiator, a cooler, a heat sink, a heat spreader, a die pad, a printed circuit board, a cooling fan, a Peltier element, a heat pipe, and a housing.

<Thermally Conductive Sheet>

The thermally conductive sheet is the thermally conductive sheet of the present invention.

Figure 3:
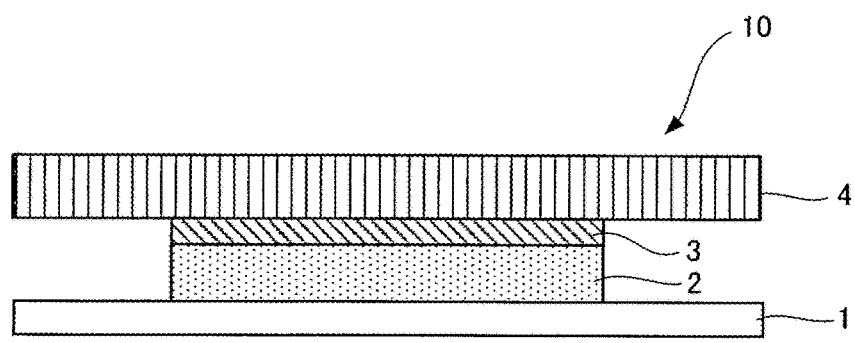
FIG. 3 is a schematic cross-sectional view illustrating one example of the semiconductor device of the present invention.

FIG. 3 is a schematic diagram illustrating one example of the semiconductor device 10, in which the semiconductor element 2 is provided on the substrate 1, and the thermally conductive sheet 3 is sandwiched between the semiconductor element 2 and the heat dissipation member 4.

EXAMPLES

Examples of the present invention are explained hereinafter, but these examples shall not be construed as to limit the scope of the present invention in any way.

In the following examples and comparative examples, the average particle diameters of alumina particles and aluminum nitride are values measured by a particle size analyzer. Moreover, the average major axis length and average minor axis length of the pitch-based carbon fibers are values measured by a microscope (KH7700, manufactured by HiROX Co., Ltd.).

Example 1

Production of Thermally Conductive Sheet

A silicone resin composition was prepared by dispersing 18% by volume of alumina (average particle diameter: 4 μm, spherical shapes, specific surface area: 0.3 m²/g, manufactured by Nippon Steel & Sumikin Materials Co., Ltd.) the specific surface area of which had been adjusted by classification, 21% by volume of aluminum nitride (average particle diameter: 1 μm, spherical shapes, specific surface area: 3 m²/g, H-grade, manufactured by Tokuyama Corporation), and 31% by volume of pitch-based carbon fibers (average fiber length: 100 μm, average minor axis length: 9.2 μm, XN100-10M, manufactured by Nippon Graphite Fiber Co., Ltd.) in a two-part addition-curable liquid silicone resin, in which a silicone A liquid (organopolysiloxane containing a vinyl group) and a silicone B liquid (organopolysiloxane containing a H—Si group) were blended at a mass ratio of 3:7 (A liquid:B liquid). Note that, the unit "% by volume" in the formulation above is % by volume relative to a thermally conductive sheet to be obtained.

As for the alumina and aluminum nitride, moreover, those subjected to a coupling treatment with a silane coupling agent were used.

The obtained silicone resin composition was extrusion molded into a mold (hollow cylindrical shape)) by means of an extruder, to thereby produce a silicone molded product. A slit (extrusion port shape: flat plate) is formed at an extrusion part of the extruder.

The obtained silicone molded product was heated at 100° C. for 6 hours, to thereby obtain a silicone cured product.

The obtained silicone cured product was sliced in the vertical direction relative to the extruding direction to give the average thickness of 100 μm by means of a ultrasonic wave cutter (oscillating frequency: 20.5 kHz, amplitude: 50 μm to 70 μm). In the manner as described above, a thermally conductive sheet of Example 1, which had the average thickness of 100 μm, and was in the shape of a square having a length of 30 mm, and a width of 30 mm.

Figure 4:
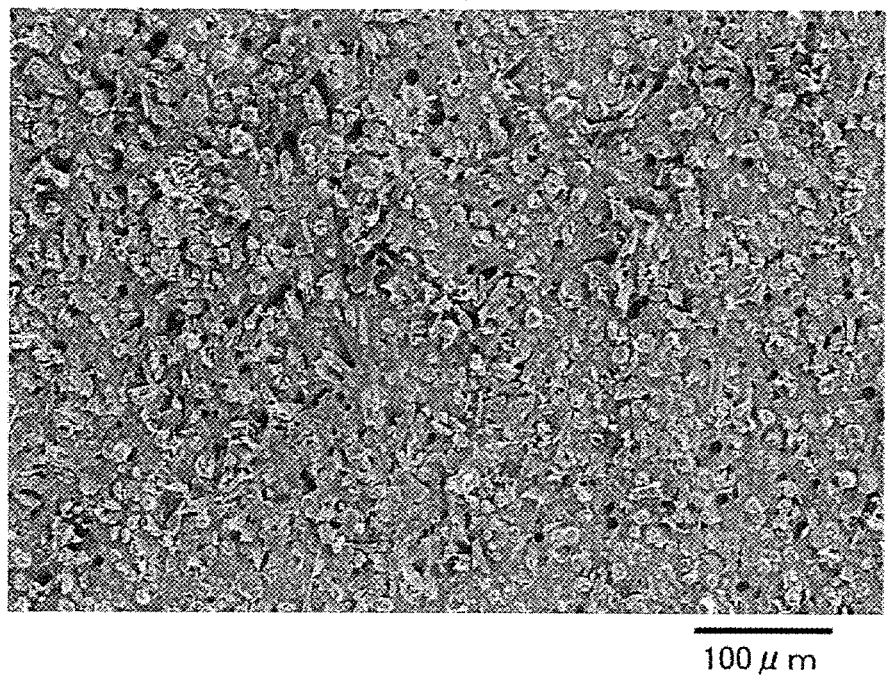
FIG. 4 is a SEM photograph of a surface of the thermally conductive sheet of Example 1.

A cross-section of the obtained thermally conductive sheet was observed under a microscope (KH7700, manufactured by HiROX Co., Ltd.). As a result, the pitch-based carbon fiber was aligned with an angle of 0 degrees to 5 degrees relative to a thickness direction of the thermally conductive sheet. A SEM photograph of a surface of the thermally conductive sheet is depicted in FIG. 4.

Figure 5:
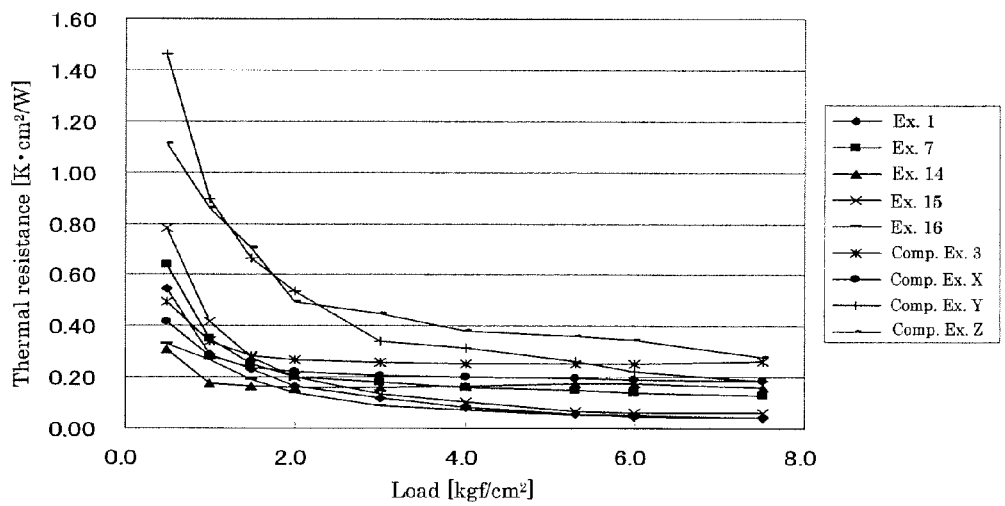
FIG. 5 is a graph depicting a relationship between a load and thermal resistance.

Moreover, a compression ratio of the obtained thermally conductive sheet was measured. The result thereof is presented in Table 5-1.
[Evaluation]
<Thermal Resistance>
A thermal resistance was measured in accordance with ASTM-D5470. The results are presented in Tables 1 and 4, and FIG. 5.

The thermal resistance was measured with each of loads of 0.5 kgf/cm², 1.0 kgf/cm², 1.5 kgf/cm², 2.0 kgf/cm², 3.0 kgf/cm², 4.0 kgf/cm², 5.3 kgf/cm², 6.0 kgf/cm², and 7.5 kgf/cm².

<Flexibility>
The flexibility of the thermally conductive sheet was evaluated with the compression ratio of the thermally conductive sheet. Specifically, a compression ratio of the thermally conductive sheet when a load of 7.5 kgf/cm² was applied thereto was measured, and the result was evaluated based on the following evaluation criteria.
[Evaluation Criteria]
I: The compression ratio was 5% or greater.
II: The compression ratio was less than 5%.
<Whether part of carbon fibers is aligned at surface of thermally conductive sheet in a manner that major axes of carbon fibers are aligned along in-plane direction of thermally conductive sheet (presence of carbon fiber at surface of thermally conductive sheet)>
Whether or not part of the carbon fibers was aligned at the surface of the thermally conductive sheet in a manner that the major axes of the carbon fibers were aligned along the in-plane direction of the thermally conductive sheet was confirmed with a SEM photograph as in FIG. 4. It was evaluated based on the following evaluation criteria. The result is presented in Table 1.
[Evaluation Criteria]
A: Aligned
B: Not aligned Examples 2 to 15, Comparative Examples 1 to 4

A thermally conductive sheet of each of Examples 2 to 15, and Comparative Examples 1 to 4 was produced in the same manner as in Example 1, provided that the type and amount (% by volume) of the carbon fibers, the type and amount (% by volume) of the alumina, the type and amount (% by volume) of the aluminum nitride, and the average thickness of the thermally conductive sheet were changed as depicted in Tables 1 to 3.

The obtained thermally conductive sheet was evaluated in the same manner as in Example 1. The results are presented in Tables 1 to 4 and FIG. 5.

Example 16

A thermally conductive sheet was produced in the same manner as in Example 1, provided that the blending ratio (mass ratio) of the silicone A liquid to the silicone B liquid was changed to 5:5.

Figure 6:
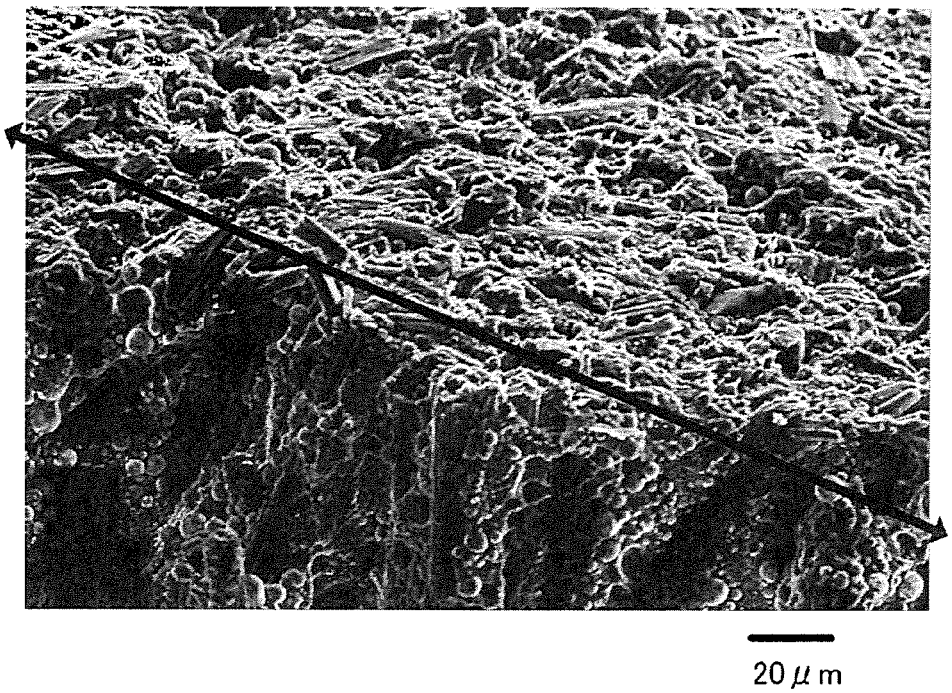
FIG. 6 is SEM photographs of a surface and cross-section of the thermally conductive sheet of Example 16.

The obtained thermally conductive sheet was evaluated in the same manner as in Example 1. The results are presented in Table 3 and FIG. 5. Moreover, the compression ratio with each load was measured. The measurement results are presented in Table 5-1. Moreover, a SEM photograph of the thermally conductive sheet is depicted in FIG. 6. The upper part above the arrow depicts the surface of the thermally conductive sheet, and the lower part below the arrow depicts the cross-section of the thermally conductive sheet.

Example 17

A thermally conductive sheet was produced in the same manner as in Example 7, provided that the blending ratio (mass ratio) of the silicone A liquid to the silicone B liquid was changed to 5:5.

The obtained thermally conductive sheet was evaluated in the same manner as in Example 1. The results are presented in Table 3. Moreover, the compression ratio with each load was measured. The measurement results are presented in Table 5-2.

Comparative Example X, Y, Z

A relationship between an applied load and thermal resistance of thermally conductive sheets of commercial products was measured in the same manner as in Example 1. The results are presented in Table 4 and FIG. 5.

Note that, the thermally conductive sheet of Comparative Example X is SS-HCTα50-302 (thickness: 0.2 mm) manufactured by Shinwa Sangyo Co., Ltd., the thermally conductive sheet of Comparative Example Y is an indium sheet manufactured by Axis Corporation, and the thermally conductive sheet of Comparative Example Z is an indium sheet manufactured by Nilaco Corporation.

TABLE 1

| | | | | | Ex. 1 | Ex. 2 | Ex. 3 | Ex. 4 | Ex. 5 | Ex. 6 | Ex. 7 |
|---|---|---|---|---|---|---|---|---|---|---|---|
| Carbon fiber | Average fiber length | 50 μm | | | — | — | — | — | — | — | — |
| | | 100 μm | | | 31 | 35 | 28 | 33 | 31 | — | — |
| | | 150 μm | | | — | — | — | — | — | 24.5 | 20 |
| | | 250 μm | | | — | — | — | — | — | — | — |
| | Total amount of carbon fibers (vol %) | | | | 31 | 35 | 28 | 33 | 31 | 24.5 | 20 |
| Alumina AlN | Average particle diameter | 4 μm | Specific surface area | 0.3 $m^2$/g | 18 | 15.5 | 19 | 16 | 18 | 20 | 21 |
| | | 5 μm | | 0.7 $m^2$/g | — | — | — | — | — | — | — |
| | | 5 μm | | 0.9 $m^2$/g | — | — | — | — | — | — | — |
| | | 1 μm | | 1 $m^2$/g | — | 20.5 | 22 | 19 | 21 | — | — |
| | | 1 μm | | 3 $m^2$/g | 21 | — | — | — | — | 23 | 23 |
| | Total amount of inorganic filler (vol %) | | | | 39 | 36 | 41 | 35 | 39 | 43 | 44 |
| | Average thickness of Thermally conductive sheet [μm] | | | | 100 | 100 | 130 | 140 | 350 | 350 | 260 |
| Thermal resistance (Load: 7.5 kgf/$cm^2$) | Average thickness when measured [μm] | | | | 60 | 60 | 80 | 100 | 300 | 300 | 200 |
| | Thermal resistance [K · $cm^2$/W] | | | | 0.04 | 0.04 | 0.07 | 0.08 | 0.10 | 0.15 | 0.13 |
| | Flexibility | | | | I | I | I | I | I | I | I |
| | Presence of carbon fiber at surface of thermally conductive sheet | | | | B | B | B | B | B | B | B |

TABLE 2

| | | | | | Ex. 8 | Ex. 9 | Ex. 10 | Ex. 11 | Ex. 12 | Ex. 13 | Ex. 14 | Ex. 15 |
|---|---|---|---|---|---|---|---|---|---|---|---|---|
| Carbon fiber | Average fiber length | 50 μm | | | — | — | — | — | — | 2 | — | — |
| | | 100 μm | | | 31 | 31 | 31 | — | 23 | 25 | — | 31 |
| | | 150 μm | | | — | — | — | 22 | — | — | 23 | — |
| | | 250 μm | | | — | — | — | — | 5 | — | — | — |
| | Total amount of carbon fibers (vol %) | | | | 31 | 31 | 31 | 22 | 28 | 27 | 23 | 31 |
| Alumina AlN | Average particle diameter | 4 μm | Specific surface area | 0.3 $m^2$/g | 16 | 18 | 16 | — | 18 | 20 | 44 | 18 |
| | | 5 μm | | 0.7 $m^2$/g | 2 | — | 2 | — | — | — | — | — |
| | | 5 μm | | 0.9 $m^2$/g | — | — | — | 20 | — | — | — | — |
| | | 1 μm | | 1 $m^2$/g | 21 | 19 | 19 | — | — | 20 | — | — |
| | | 1 μm | | 3 $m^2$/g | — | 2 | 2 | 23 | 22 | — | — | 21 |
| | Total amount of inorganic filler (vol %) | | | | 39 | 39 | 39 | 43 | 40 | 40 | 44 | 39 |
| | Average thickness of Thermally conductive sheet [μm] | | | | 150 | 140 | 150 | 360 | 150 | 250 | 260 | 240 |
| Thermal resistance (Load: 7.5 kgf/$cm^2$) | Average thickness when measured [μm] | | | | 100 | 100 | 100 | 300 | 100 | 200 | 200 | 200 |
| | Thermal resistance [K · $cm^2$/W] | | | | 0.06 | 0.05 | 0.04 | 0.16 | 0.15 | 0.13 | 0.16 | 0.06 |
| | Flexibility | | | | I | I | I | I | I | I | I | I |
| | Presence of carbon fiber at surface of thermally conductive sheet | | | | B | B | B | B | B | B | B | B |

TABLE 3

| | | | | Ex. 16 | Ex. 17 | Comp. Ex. 1 | Comp. Ex. 2 | Comp. Ex. 3 | Comp. Ex. 4 |
|---|---|---|---|---|---|---|---|---|---|
| Carbon fiber | Average fiber length | 50 μm | | — | — | — | — | — | — |
| | | 100 μm | | 31 | — | — | — | — | — |
| | | 150 μm | | — | 20 | 24.5 | 22 | 20 | 20 |
| | | 250 μm | | — | — | — | — | — | — |
| | Total amount of carbon fibers (vol %) | | | 31 | 20 | 24.5 | 22 | 20 | 20 |
| Alumina | Average particle diameter | 4 μm | Specific surface area 0.3 m²/g | 18 | 21 | 20 | — | 21 | — |
| AlN | | 5 μm | 0.7 m²/g | — | — | — | — | — | — |
| | | 5 μm | 0.9 m²/g | — | — | — | 20 | — | — |
| | | 1 μm | 1 m²/g | — | — | — | — | — | — |
| | | 1 μm | 3 m²/g | 21 | 23 | 23 | 23 | 23 | — |
| | Total amount of inorganic filler (vol %) | | | 39 | 44 | 43 | 43 | 44 | 0 |
| | Average thickness of Thermally conductive sheet [μm] | | | 100 | 260 | 410 | 410 | 500 | — |
| Thermal resistance (Load: 7.5 kgf/cm²) | Average thickness when measured [μm] | | | 60 | 200 | 350 | 350 | 450 | — |
| | Thermal resistance [K·cm²/W] | | | 0.04 | 0.13 | 0.17 | 0.18 | 0.26 | — |
| | Flexibility | | | I | I | I | I | I | — |
| | Presence of carbon fiber at surface of thermally conductive sheet | | | A | A | B | B | B | B |

*carbon fibers (average fiber length: 50 μm): XN100-05M (manufactured by Nippon Graphite Fiber Co., Ltd.)

*carbon fibers (average fiber length: 100 μm): XN100-10M (manufactured by Nippon Graphite Fiber Co., Ltd.)

*carbon fibers (average fiber length: 150 μm): XN100-15M (manufactured by Nippon Graphite Fiber Co., Ltd.)

*carbon fibers (average fiber length: 250 μm): XN100-25M (manufactured by Nippon Graphite Fiber Co., Ltd.)

*alumina: manufactured by Nippon Steel & Sumikin Materials Co., Ltd.

*AlN (specific surface area: 1 m²/g): JC (manufactured by Toyo Aluminum K.K.)

*AlN (specific surface area: 3 m²/g): H Grade (manufactured by Tokuyama Corporation)

TABLE 4

| | | Load [kgf/cm²] | | | | | | | | |
|---|---|---|---|---|---|---|---|---|---|---|
| | | 0.5 | 1.0 | 1.5 | 2.0 | 3.0 | 4.0 | 5.3 | 6.0 | 7.5 |
| Ex. 1 | Thermal resistance [K·cm²/W] | 0.55 | 0.29 | 0.23 | 0.16 | 0.12 | 0.08 | 0.05 | 0.05 | 0.04 |
| Ex. 7 | Thermal resistance [K·cm²/W] | 0.64 | 0.35 | 0.25 | 0.20 | 0.18 | 0.16 | 0.15 | 0.14 | 0.13 |
| Ex. 14 | Thermal resistance [K·cm²/W] | 0.31 | 0.17 | 0.17 | 0.16 | 0.16 | 0.17 | 0.17 | 0.18 | 0.16 |
| Ex. 15 | Thermal resistance [K·cm²/W] | 0.78 | 0.41 | 0.28 | 0.20 | 0.13 | 0.10 | 0.07 | 0.06 | 0.06 |
| Comp. Ex. 3 | Thermal resistance [K·cm²/W] | 0.50 | 0.34 | 0.28 | 0.27 | 0.26 | 0.25 | 0.25 | 0.25 | 0.26 |
| Comp. Ex. X | Thermal resistance [K·cm²/W] | 0.42 | 0.28 | 0.24 | 0.22 | 0.20 | 0.20 | 0.19 | 0.19 | 0.18 |
| Comp. Ex. Y | Thermal resistance [K·cm²/W] | 1.46 | 0.89 | 0.66 | 0.54 | 0.34 | 0.31 | 0.26 | 0.22 | 0.19 |
| Comp. Ex. Z | Thermal resistance [K·cm²/W] | 1.11 | 0.86 | 0.71 | 0.49 | 0.45 | 0.38 | 0.36 | 0.34 | 0.28 |

TABLE 5-1

| | | Load [kgf/cm²] | | | | | | | | |
|---|---|---|---|---|---|---|---|---|---|---|
| | | 0.5 | 1.0 | 1.5 | 2.0 | 3.0 | 4.0 | 5.3 | 6.0 | 7.5 |
| Ex. 1 | Thermal resistance [K·cm²/W] | 0.55 | 0.29 | 0.23 | 0.16 | 0.12 | 0.08 | 0.05 | 0.05 | 0.04 |
| | Compression ratio [%] | 21.6 | 25.6 | 27.9 | 31.9 | 36.5 | 37.1 | 38.8 | 39.9 | 40.5 |
| Ex. 16 | Thermal resistance [K·cm²/W] | 0.33 | 0.27 | 0.19 | 0.14 | 0.09 | 0.07 | 0.05 | 0.05 | 0.04 |
| | Compression ratio [%] | 31.0 | 33.2 | 35.6 | 38.9 | 42.1 | 44.9 | 47.4 | 48.4 | 48.9 |

TABLE 5-2

| | | Load [kgf/cm²] | | | | | | | | |
|---|---|---|---|---|---|---|---|---|---|---|
| | | 0.5 | 1.0 | 1.5 | 2.0 | 3.0 | 4.0 | 5.3 | 6.0 | 7.5 |
| Ex. 7 | Thermal resistance [K·cm²/W] | 0.64 | 0.35 | 0.25 | 0.20 | 0.18 | 0.16 | 0.15 | 0.14 | 0.13 |
| | Compression ratio [%] | 2.66 | 6.94 | 8.11 | 9.11 | 10.48 | 11.15 | 11.61 | 11.92 | 12.68 |
| Ex. 17 | Thermal resistance [K·cm²/W] | 0.48 | 0.32 | 0.24 | 0.19 | 0.17 | 0.16 | 0.14 | 0.13 | 0.13 |
| | Compression ratio [%] | 13.8 | 19.1 | 21.7 | 23.8 | 25.5 | 26.3 | 27.5 | 28.4 | 28.9 |

The thermally conductive sheets of Examples 1 to 15 had the thermal resistance of less than 0.17 K·cm²/W, as measured in accordance with ASTM-D5470 with a load of 7.5 kgf/cm², had excellent thermal resistance, and had excellent flexibility, even though the average thickness thereof was thin, i.e., 500 μm or less.

The thermally conductive sheet of Example 16, where the blending ratio (mass ratio) of the silicone A liquid to the silicone B liquid in Example 1 was changed to A liquid:B liquid=5:5, increased a contact area between a heat generating element or heat dissipation member and the carbon fiber, as part of the carbon fibers was aligned at a surface of the thermally conductive sheet in a manner that the major axes of the carbon fibers were aligned along the in-plane direction of the thermally conductive sheet. Therefore, the thermal resistance thereof was reduced. As the blending ratio (mass ratio) of the silicone A liquid to the silicone B liquid was A liquid:B liquid=5:5, moreover, a flexibility of the thermally conductive sheet was improved, and part of the carbon fiber was deposited along the surface direction of the thermally conductive sheet, which lead to reduction in the thermal resistance in case of a low load.

The thermally conductive sheet of Example 17, where the blending ratio (mass ratio) of the silicone A liquid to the silicone B liquid in Example 7 was changed to A liquid:B liquid=5:5, exhibited the similar characteristics to the above.

In Comparative Examples 1 to 3, on the other hand, excellent thermal resistance and excellent flexibility could not be attained together. In Comparative Example 4, a formability of a sheet was poor, and thus the evaluation could not be carried out.

INDUSTRIAL APPLICABILITY

Since the thermally conductive sheet of the present invention has high thermal conductivity, the thermally conductive sheet of the present invention can be preferably used around various electric devices operation efficiency or service life of which is adversely affected by temperature, such as CPU, MPU, a power transistor, LED, a laser diode, various batteries (e.g., various secondary batteries, such as a lithium ion battery, various fuel cells, and various solar batteries, such as a capacitor battery, an amorphous silicon battery, a crystalline silicon battery, a compound semiconductor battery, and a liquid junction solar battery), or around a heat source of a heating device to which effective use of heat is required, or around a heat pipe of a heat exchanger or a floor heating system.

REFERENCE SIGNS LIST

1 substrate
2 semiconductor element
3 thermally conductive sheet
4 heat dissipation member
10 semiconductor device
11 carbon fiber
12 inorganic filler

What is claimed is:
1. A thermally conductive sheet, comprising:
a binder;
carbon fibers; and
an inorganic filler,
wherein the thermally conductive sheet is to be sandwiched between a heat source and a heat dissipation member of a semiconductor device,
wherein the carbon fibers have an average fiber length of 50 μm to 250 μm,
wherein an amount of the carbon fibers in the thermally conductive sheet is 20% by volume to 40% by volume,
wherein an amount of the inorganic filler in the thermally conductive sheet is 30% by volume to 55% by volume, wherein the inorganic filler contains alumina and aluminum nitride, wherein the alumina has an average particle diameter of 4 μm to 5 μm, wherein the aluminium nitride has an average particle diameter of 0.5 μm to 1.5 μm, wherein the thermally conductive sheet having the component which shows that:

i) thermal resistance of average thickness of 400 μm or less indicates higher value than that of average thickness of 500 μm under the condition of the load of 1.0 kgf/cm$^2$ measured by ASTM-D5470; and ii) thermal resistance of average thickness of 400 μm or less indicates lower value than that of average thickness of average thickness of 500 μm under the condition of the load of 7.5 kgf/cm$^2$ measured by ASTM-D5470;

in case when two thermally conductive sheets having average thickness of 500 μm and 400 μm or less of which components of thermally conductive sheet are the same but only their average thickness is different are prepared, wherein thermal resistance of the thermally conductive sheet is less than 0.17 K·cm$^2$/W, as measured in accordance with ASTM-D5470 with a load of 7.5 kgf/cm$^2$, and wherein the thermally conductive sheet has the average thickness of 400 μm or less.

2. The thermally conductive sheet according to claim 1, wherein the thermal resistance of the thermally conductive sheet is 0.20 K·cm$^2$/W or less, as measured in accordance with ASTM-D5470 with a load in the range of 2.0 kgf/cm$^2$ to 7.5 kgf/cm$^2$.

3. The thermally conductive sheet according to claim 1, wherein part of the carbon fibers is aligned at a surface of the thermally conductive sheet in a manner that major axes of the carbon fibers are aligned along an in-plane direction of the thermally conductive sheet.

4. The thermally conductive sheet according to claim 1, wherein the average thickness (μm) of the thermally conductive sheet is greater than the average fiber length (μm) of the carbon fibers.

5. A method for producing the thermally conductive sheet according to claim 1, the method comprising:

extruding a thermally conductive composition containing a binder precursor, carbon fibers, and an inorganic filler using an extruder, to obtain an extrusion-molded product;

curing the extrusion-molded product, to obtain a cured product; and cutting the cured product in a vertical direction relative to a direction of the extruding.

6. A semiconductor device, comprising:

a heat source;

a heat dissipation member; and a thermally conductive sheet, which is sandwiched between the heat source and the heat dissipation member, wherein the thermally conductive sheet is the thermally conductive sheet according to claim 1.

* * * * *